(12) United States Patent
Faust

(10) Patent No.: US 10,948,529 B2
(45) Date of Patent: Mar. 16, 2021

(54) ADJUSTABLE SPACER ASSEMBLY FOR ELECTROMAGNETIC COMPATIBILITY TESTING

(71) Applicant: GOVERNMENT OF THE UNITED STATES, AS REPRESENTED BY THE SECRETARY OF THE ARMY, Washington, DC (US)

(72) Inventor: Scott W. Faust, Rochester Hills, MI (US)

(73) Assignee: Government of the United States, as represented by the Secretary of the Army, Washington, DC (US)

( * ) Notice: Subject to any disclaimer, the term of this patent is extended or adjusted under 35 U.S.C. 154(b) by 104 days.

(21) Appl. No.: 16/256,167

(22) Filed: Jan. 24, 2019

(65) Prior Publication Data

US 2020/0241062 A1 Jul. 30, 2020

(51) Int. Cl.
  *G01R 31/00* (2006.01)
  *H02G 3/30* (2006.01)
  *H02G 3/04* (2006.01)

(52) U.S. Cl.
  CPC ......... *G01R 31/002* (2013.01); *H02G 3/0437* (2013.01); *H02G 3/30* (2013.01)

(58) Field of Classification Search
  CPC ....... G01R 31/002; H02G 3/0437; H02G 3/30

(Continued)

(56) References Cited

U.S. PATENT DOCUMENTS 2,396,836 A   3/1946  Ellinwood
5,514,971 A * 5/1996  Hankui ............... G01R 31/001
                                                    324/501

(Continued)

FOREIGN PATENT DOCUMENTS

CN    201611758 U   1/2010
CN    203203474 U   9/2013

(Continued)

OTHER PUBLICATIONS

"Requirements for the Control of Electromagnetic Interference Characteristics of Subsystems and Equipment", Department of Defense Interface Standard, Dec. 11, 2015, 1-280, MIL-STD-461G, Department of Defense, USA.

(Continued)

*Primary Examiner* — Christopher P McAndrew
(74) *Attorney, Agent, or Firm* — Gregore P. Gibson

(57) ABSTRACT

A novel spacer assembly includes a body defining a bottom surface and a top surface opposite the bottom surface, a guide coupled to the top surface and extending along an axis, and a plurality of spacer elements movably coupled to the guide along the axis and being configured to receive a plurality of electrical leads therebetween. Each of the spacer elements extends above the top surface of the body and defines a predetermined width along the axis. When the leads are placed between the spacer elements, a spacing between adjacent ones of the leads corresponds to the predetermined width of the interposing spacer element. The predetermined width corresponds to a predefined electromagnetic compatibility (EMC) testing criteria. The spacer assembly facilitates rapid placement and accurate spacing of leads during initial EMC test setup or reconfiguration.

22 Claims, 8 Drawing Sheets

US 10,948,529 B2
Page 2

(58) Field of Classification Search
USPC .......................................................... 324/537
See application file for complete search history.

(56) References Cited

U.S. PATENT DOCUMENTS

| | | | | |
|---|---|---|---|---|
| 5,949,230 | A * | 9/1999 | Kobayashi | G01R 1/07 324/544 |
| 6,037,782 | A * | 3/2000 | Pommerenke | G01R 29/0821 324/501 |
| 6,273,030 | B1 * | 8/2001 | Harth, III | F22B 37/202 110/325 |
| 6,528,728 | B1 | 3/2003 | Shima | |
| 8,519,275 | B2 * | 8/2013 | Hashimoto | G06F 1/183 174/480 |
| 8,757,560 | B2 * | 6/2014 | Darnell | H02G 3/0456 248/63 |
| 9,732,884 | B1 * | 8/2017 | Keller | F16L 3/2235 |
| 10,644,486 | B2 * | 5/2020 | Gintz | F16L 3/08 |
| 2002/0095304 | A1 * | 7/2002 | Khazei | G01R 31/002 702/127 |
| 2007/0221793 | A1 * | 9/2007 | Kusuda | H02G 3/32 248/71 |
| 2007/0236207 | A1 * | 10/2007 | Thomason | G01R 31/002 324/96 |
| 2008/0087465 | A1 | 4/2008 | Anderson | |
| 2010/0207641 | A1 * | 8/2010 | Hailey | G01R 31/2851 324/555 |
| 2011/0155451 | A1 * | 6/2011 | Hashimoto | G06F 1/183 174/535 |
| 2012/0006947 | A1 * | 1/2012 | Gundel | F16L 3/02 248/68.1 |
| 2012/0017682 | A1 * | 1/2012 | Cozza | G01R 29/0871 73/586 |
| 2012/0025024 | A1 * | 2/2012 | Robrecht | H02G 3/0456 244/131 |
| 2012/0111598 | A1 * | 5/2012 | Pawluk | H02G 3/0437 174/68.3 |
| 2014/0008123 | A1 * | 1/2014 | Pawluk | H02G 3/0437 174/99 R |
| 2015/0227665 | A1 * | 8/2015 | Shepherd | G06F 30/39 716/132 |
| 2015/0369397 | A1 | 12/2015 | McCoy | |
| 2018/0109332 | A1 * | 4/2018 | Baar | H01Q 1/48 |
| 2019/0006827 | A1 * | 1/2019 | Gintz | H02G 3/0456 |

FOREIGN PATENT DOCUMENTS

| | | |
|---|---|---|
| CN | 103388708 A | 11/2013 |
| CN | 103904600 A | 7/2014 |
| CN | 105605326 A | 5/2016 |
| CN | 105673942 A | 6/2016 |
| CN | 106044376 A | 10/2016 |
| DE | 3420261 A1 | 12/1985 |
| JP | H11220826 A | 8/1999 |
| KR | 101717273 B1 | 3/2017 |
| NL | 1037999 C | 12/2011 |

OTHER PUBLICATIONS https://8020.net/university-tslot; "The Core Building Blocks, How the Structure of Any Project Begins"; 80/20.net; accessed Oct. 11, 2018; 80/20 Inc., USA.
www.spectreperformance.com/images/1/SPE-18483.jpg; Spectre 18483 wire separator; accessed Apr. 16, 2018.

* cited by examiner

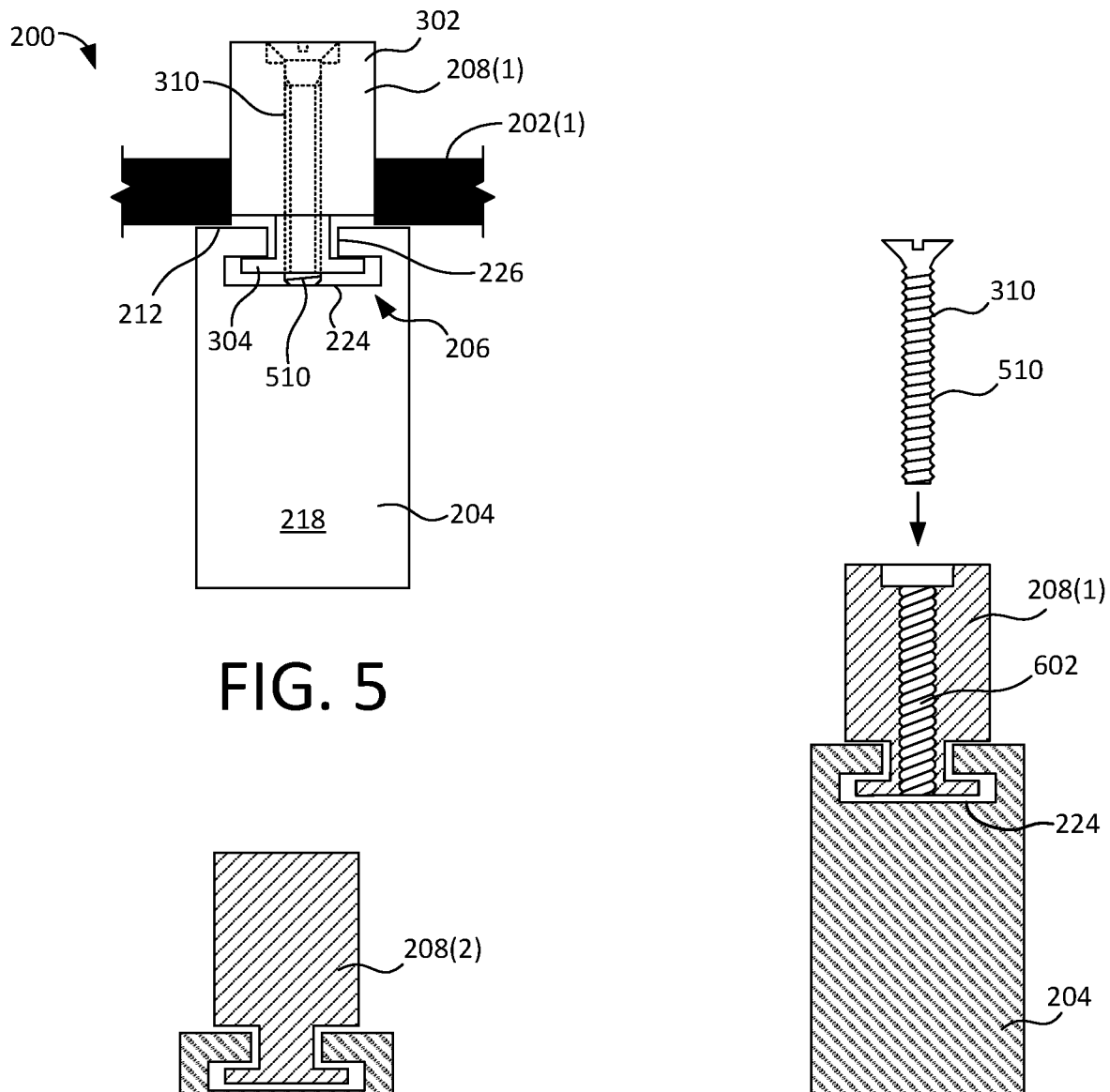

ADJUSTABLE SPACER ASSEMBLY FOR ELECTROMAGNETIC COMPATIBILITY TESTING

GOVERNMENT INTEREST

The inventions described herein may be made, used, or licensed by or for the U.S. Government for U.S. Government purposes without payment of royalties to me.

BACKGROUND OF THE INVENTION

Field of the Invention

The present invention relates generally to spacers and, more particularly, to an adjustable spacer assembly for spacing electrically-conductive elements. Even more particularly, the present invention relates to an adjustable spacer assembly for spacing adjacent conductors for electromagnetic compatibility testing.

Description of the Background Art

FIG. 1 is a perspective view showing a prior art electromagnetic compatibility (EMC) testing setup 100. EMC testing is performed on electronics equipment and electrical wiring, for example, to determine how the equipment and wiring interacts electromagnetically with its environment and to ensure that emitted EM radiation is within specifications.

EMC testing setup 100 includes a test bench 102 installed in an electromagnetic (EM) anechoic chamber enclosed by a floor 104 and plurality of walls. Only the rear wall 106 of the chamber is shown in FIG. 1 so as not to obscure the other elements. Test bench 102 includes a ground plane 108 (e.g., a copper surface, etc.) on which components associated with EMC testing are arranged. Such components include equipment under test (EUT) 110, line impedance stabilization network (LISN) equipment 112, 114, and a plurality of electrical leads 116(1-n) temporarily affixed on a non-conductive sheet of material 118 via a plurality of pieces of tape 120. EUT 110 represents any electronic component undergoing EMC testing. LISN equipment 112 and 114 condition the impedance of source and return direct current (DC) power, respectively, between EUT 110 and a power source 122 over a frequency range. Some of leads 116 carry electrical power between EUT 110 and power source 122 whereas others of leads 116 communicate electrical signals between EUT 110 and a signal terminal 124, which provides relevant control signals and/or data to EUT 110 to operate EUT 110 for EMC testing. Non-conductive sheet 118 elevates leads elements 116(1-n) above ground plane 108, and tape 120 is used to secure leads 116(1-n) to non-conductive sheet 118 in a desired configuration for EMC testing. A plurality of bond straps 126 electrically couple ground plane 108 to the EMC test chamber via rear wall 106. It is desirable that the testing materials (e.g., tape, sheet 118, etc.) not change the electromagnetic environment in the test chamber so the EMC evaluation of EUT 110 and leads 116(1-n) is as accurate as possible.

EMC testing criteria often specify how the leads 116(1-n) are to be arranged during EMC testing. For example, Section 4.3.8.6.1 of MIL-STD-461G (11 Dec. 2015) specifies that "[a]ll cables shall be supported 5 cm above the ground plane . . . " (e.g., ground plane 108) and " . . . individual cables shall be separated by 2 cm measured from their outer circumference . . . " for EMC testing. Similarly, Section 4.3.8.6.2 provides that "[a]ll power leads shall be supported 5 cm above the ground plane . . . ". Such rigid EMC testing criteria are difficult to comply with due to variabilities in testing setup.

As shown in FIG. 1, pieces of tape 120 are used to secure leads 116(1-n) at the spacing required by the above EMC testing standard, but do a poor job. For example, it is difficult to maintain leads 116 in parallel at the proper separation because leads 116 have a shape "memory" and prefer to restore themselves to their prior shapes. Because leads 116 are prone to movement on their own, leads 116 will either pull the tape 120 up or require placement of a lot of tape 120 to keep them in position. Lead placement is, therefore, a very time consuming process for the EMC test engineer or technician. Accordingly, it is often the case that leads 116(1-n) are out of parallel and do not maintain the 2 cm spacing therebetween for testing.

The taping method also provides other disadvantages. For example, changing any of the wiring setup on sheet 118 requires the tape to be removed and reinstalled, which is a slow process especially for EUTs 110 involving many leads 116. This wastes time and labor resources. Moreover, because the spacing of leads 116 will be slightly different each time a testing is set up, the repeatability of a series of EMC tests is low.

Some solutions to improve wire spacing in EMC testing have been proposed, but fall short. For example, trays that have pre-formed grooves have been developed. Unfortunately, such trays do not easily accommodate leads of varying diameters, manually twisted leads, wiring harnesses, etc. Accordingly, such trays are unsuitable for use with strict EMC testing standards, such as MIL-STD-461G discussed above.

SUMMARY OF THE INVENTION

The present invention overcomes the problems associated with the prior art by providing an adjustable spacer assembly for EMC testing that facilitates rapid placement and spacing of leads of equipment under test according to predefined EMC testing criteria. The invention advantageously reduces EMC testing setup time and improves repeatability of EMC testing by enabling a technician to quickly and accurate set lead spacing and/or lead height.

A spacer assembly according to an exemplary embodiment includes a body defining a bottom surface and a top surface opposite the bottom surface, a guide coupled to the top surface and extending along an axis, and a plurality of spacer elements movably coupled to the guide along the axis and being configured to receive a plurality of elongated, electrically-conductive elements therebetween. Each of the spacer elements extends above the top surface of the body and defines a predetermined width along the axis. Additionally, when the plurality of electrically-conductive elements are placed in parallel between and in contact with the spacer elements, a spacing between adjacent ones of the electrically-conductive elements corresponds to the predetermined width of an interposing one of the spacer elements. The predetermined width corresponds to a first electromagnetic compatibility (EMC) testing criteria.

In one particular embodiment, the top surface of the body is disposed at a predetermined height above the bottom surface, where the predetermined height corresponds to a second EMC testing criteria different from the first EMC testing criteria. Accordingly, when the plurality of electrically-conductive elements are placed between the spacer elements, the electrically-conductive elements are further disposed at the predetermined height. In a more particular embodiment, each of the predetermined width and the predetermined height varies by no more than 5%.

In another particular embodiment, the predetermined width of a spacer element varies by no more than 5%.

In still another particular embodiment, the body, the guide, and the plurality of spacer elements are formed from a material having relative permittivity of no more than 5.

In yet another particular embodiment, at least one of the plurality of spacer elements includes a fixing mechanism configured to selectively secure the at least one spacer element in position along the axis. In a more particular embodiment, the fixing mechanism is configured to increase interference between the spacer element and the guide. In an even more particular embodiment, the fixing mechanism includes a threaded member configured to move the spacer element into engagement with the guide.

In still another particular example, each of the plurality of spacer elements comprises a cylindrical portion disposed above the top surface, where the cylindrical portion has a diameter corresponding to the predetermined width. In one more particular example, the cylindrical portion of each of the plurality of spacer elements has the same diameter. In another more particular example, each of the spacer elements comprises an adapter portion configured to movably engage the guide such that the each of the spacer elements can be adjustably positioned along the axis defined by the guide. Optionally, the adapter portion permits rotation of the each of the spacer elements within the guide.

In yet another particular example embodiment, the guide is formed in the body. More particularly, the guide can include a channel formed through the body along the axis, where the channel defines a slot through the top surface. Even more particularly, the body defines one or more sidewalls between the top and the bottom surfaces, the channel is formed through at least one of the sidewalls, and the channel comprises an inverted-T channel.

An exemplary method for spacing electrically-conductive elements coupled to equipment undergoing EMC testing is also disclosed. The method includes the steps of providing at least one spacer assembly, providing a plurality of elongated, electrically-conductive elements, and positioning the at least one spacer assembly on a test bench configured for EMC testing. Each spacer assembly includes a body, a guide coupled to the body, and a plurality of spacer elements movably coupled to the guide along an axis defined by the guide. Each of the spacer elements has a predetermined width along the axis, and the spacer assembly is positioned on the test bench such that the spacer elements are upright. Additionally, the method includes the steps of placing a first one of the electrically-conductive elements over the body and in contact with a first one of the spacer elements, moving a second one of the spacer elements into contact with the first electrically-conductive element, and placing a second one of the electrically-conductive elements over the body and in contact with the second spacer element such that the first and the second electrically-conductive elements are separated by a predetermined width of the second spacer element. The predetermined width corresponds to a first electromagnetic compatibility (EMC) testing criteria.

A particular method further includes the steps of moving a third one of the spacer elements into contact with the second electrically-conductive element opposite the second spacer element, and placing a third one of the electrically-conductive elements over the body and in contact with the third spacer element such that the second and the third electrically-conductive elements are separated by a predetermined width of the third spacer element. The predetermined width of the third spacer element is equal to the predetermined width of the second spacer element. Optionally, the first, second, and third electrically-conductive elements can have different outer diameters/circumferences.

Another particular method includes the step of fixing the first spacer element, but not the second spacer element, in position along the axis defined by the guide.

BRIEF DESCRIPTION OF THE DRAWINGS

The present invention is described with respect to the following figures, wherein like reference numbers indicate substantially-similar elements:

FIG. 5 is an end view of the spacer assembly of FIG. 2;

FIG. 6 is a partially exploded and cross-sectioned view of a spacer element of the spacer assembly of FIG. 2 taken along line A-A of FIG. 4;

FIG. 7 is a cross-sectional view of another spacer element of the spacer assembly of FIG. 2 taken along line B-B of FIG. 4;

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention. In other instances, details of well-known components and manufacturing practices (e.g., milling, 3D printing, etc.) have been omitted so as to avoid unnecessarily obscuring the present invention.

Figure 1:
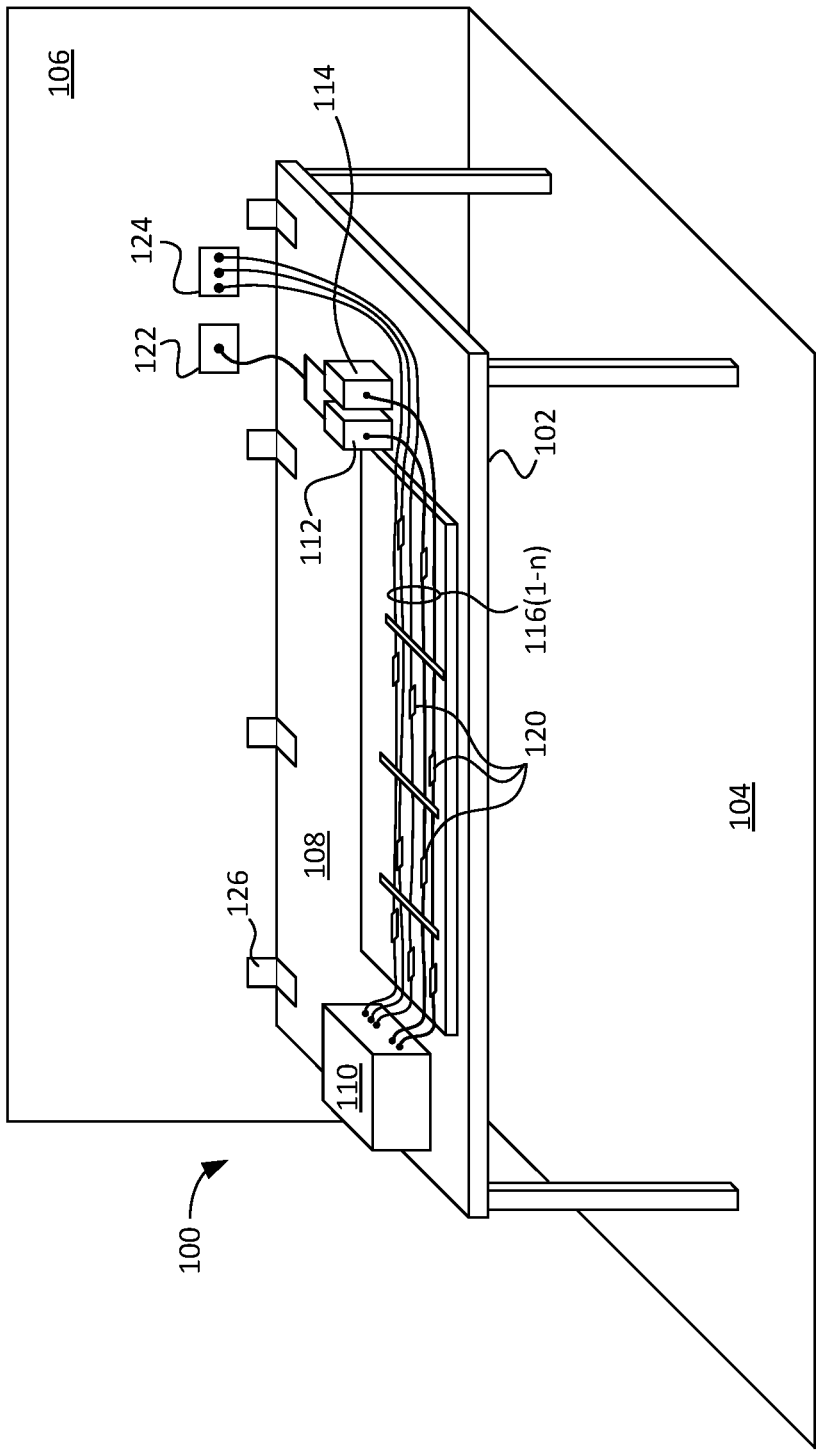
FIG. 1 is a perspective view showing a prior art electromagnetic compatibility (EMC) testing setup.
Figure 2:
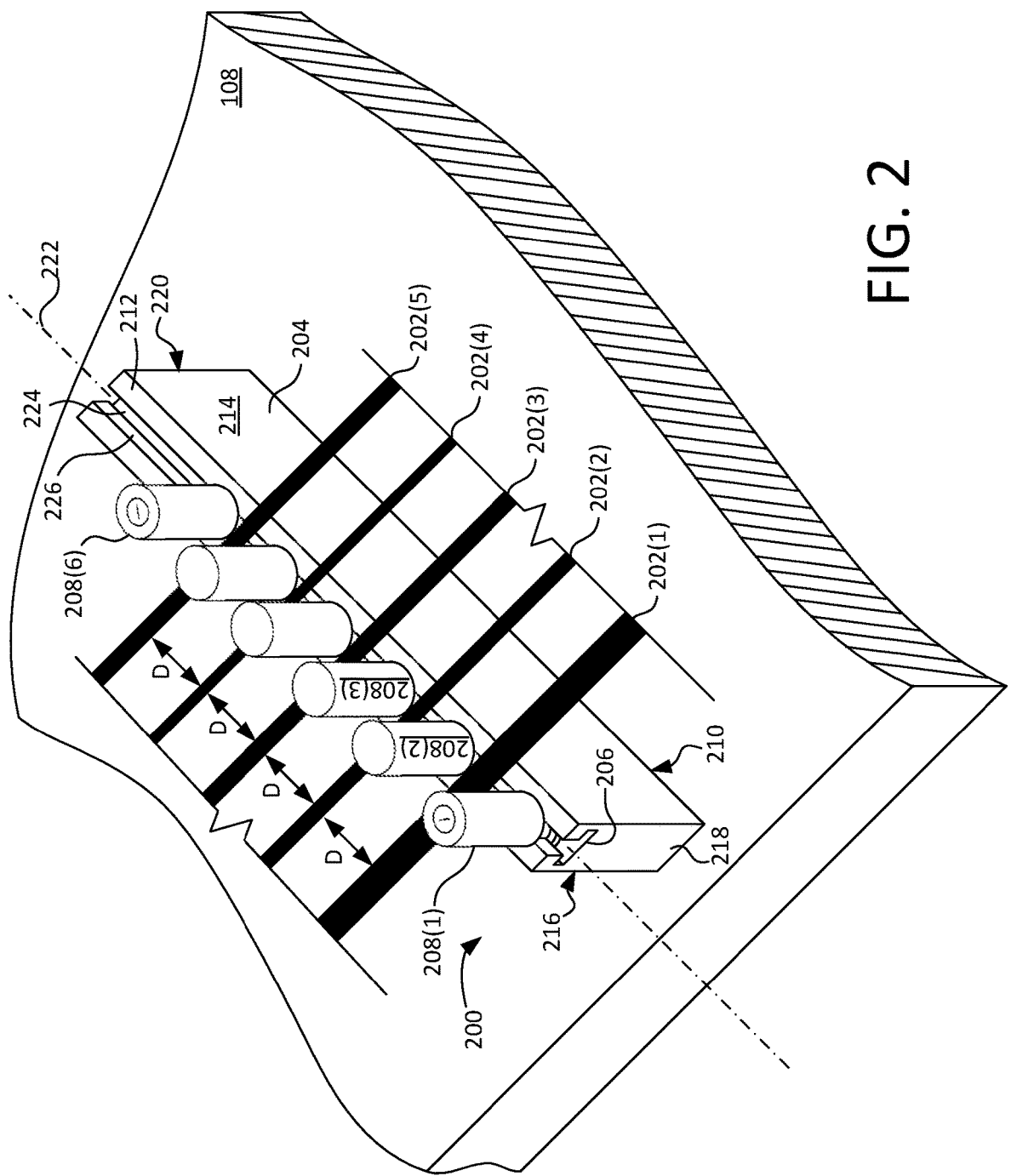
FIG. 2 is a perspective view showing a spacer assembly according to an exemplary embodiment of the present invention.

FIG. 2 is a perspective view showing a spacer assembly 200, according to one embodiment of the present invention. The spacer assembly 200 is configured to support a plurality of elongated, electrically-conductive elements 202(1-n) above ground plane 108 of test bench 102 during EMC testing. In this exemplary embodiment, five electrically-conductive elements 202(1-5) are shown, but spacer assembly 200 could support more or fewer such elements 202 as desired. Electrically-conductive elements 202(1-n) will be referred to hereinafter as leads 202(1-n) for simplicity. However, it should be understood that electrically-conductive elements 202(1-n) should be interpreted expansively to include any electrically-conductive elements suitable for communicating electrical power and/or signals between EUT 110 and power source 122 and/or between EUT 110 and signal terminal 124. Electrically-conductive elements 202(1-n) include, but are not limited to, wires, leads, cables or cords comprising one or more wires, etc. Additionally, an electrically-conductive element 202 can comprise a multi-lead wiring harnesses, a twisted plurality of leads, etc.

Spacer assembly 200 includes a body 204, a guide 206, and a plurality of spacer elements 208(1-m). Body 204 defines a bottom surface 210, a top surface 212 opposite bottom surface 210, a first pair of opposing (long) sidewalls 214, 216, and a second pair of opposing (short) sidewalls 218, 220. Guide 206 is coupled to top surface 212 of body 204 and extends along (defines) an axis 222. More specifically, in this embodiment, guide 206 defines a channel 224 formed through body 204 along axis. Channel 224 includes a slot 226 formed through top surface 212.

Spacer elements 208(1-m) are movably coupled within channel 224 such that they extend above top surface 212 of body 204. Spacer elements 208(1-m) are configured to receive the plurality leads 202(1-n) therebetween and space the leads 202 at the leads' outer circumferences by desired amount(s). In this example, there are six spacer elements 208(1-6), which receive and space five leads 202(1-5). When the leads 202(1-5) are placed between and in contact with the spacer elements 208(1-6), a spacing between adjacent ones of the leads 202 corresponds to a predetermined width of the interposing spacer elements 206 along axis 222. For example, leads 202(1) and 202(2) are separated at their outer circumferences by an amount corresponding to the outside diameter (D) of cylindrical spacer element 208(2). Similarly, leads 202(2) and 202(3) are separated at their outer circumferences by an amount corresponding to the outside diameter (D) of cylindrical spacer element 208(3). Because the diameters (D) of all spacer elements 208 interposed between adjacent pairs of leads 202 are the same in this example, all of leads 202 are equally spaced at their outer circumferences by a predetermined distance (D), regardless of the individual diameters of the adjacent leads 202.

Here, the predetermined width/diameter (D) corresponds to a first EMC testing criteria. In a more particular embodiment, the outside diameter of each such spacer element 208 is equal to 2 cm+/−5% such that the spacing of leads 202 complies with MIL-STD-461G discussed above.

Spacer assembly 200 also stands on ground plane 108 via bottom surface 210 of body 204, such that spacer elements 208(1-m) are positioned generally vertically. Additionally, top surface 212 is generally flat and located at a predetermined height, H (FIG. 3), above bottom surface 210. Accordingly, when leads 202(1-n) are placed on body 204, body 204 supports leads 202(1-n) above ground plane 108 by an amount equal to the predetermined height, H. In a particular embodiment, the predetermined height H corresponds to a second EMC testing criteria. In a more particular embodiment, the predetermined height H is equal to 5 cm+/−5% such that the height of leads 202(1-n) above ground plane 108 complies with MIL-STD-461G.

Figure 3:
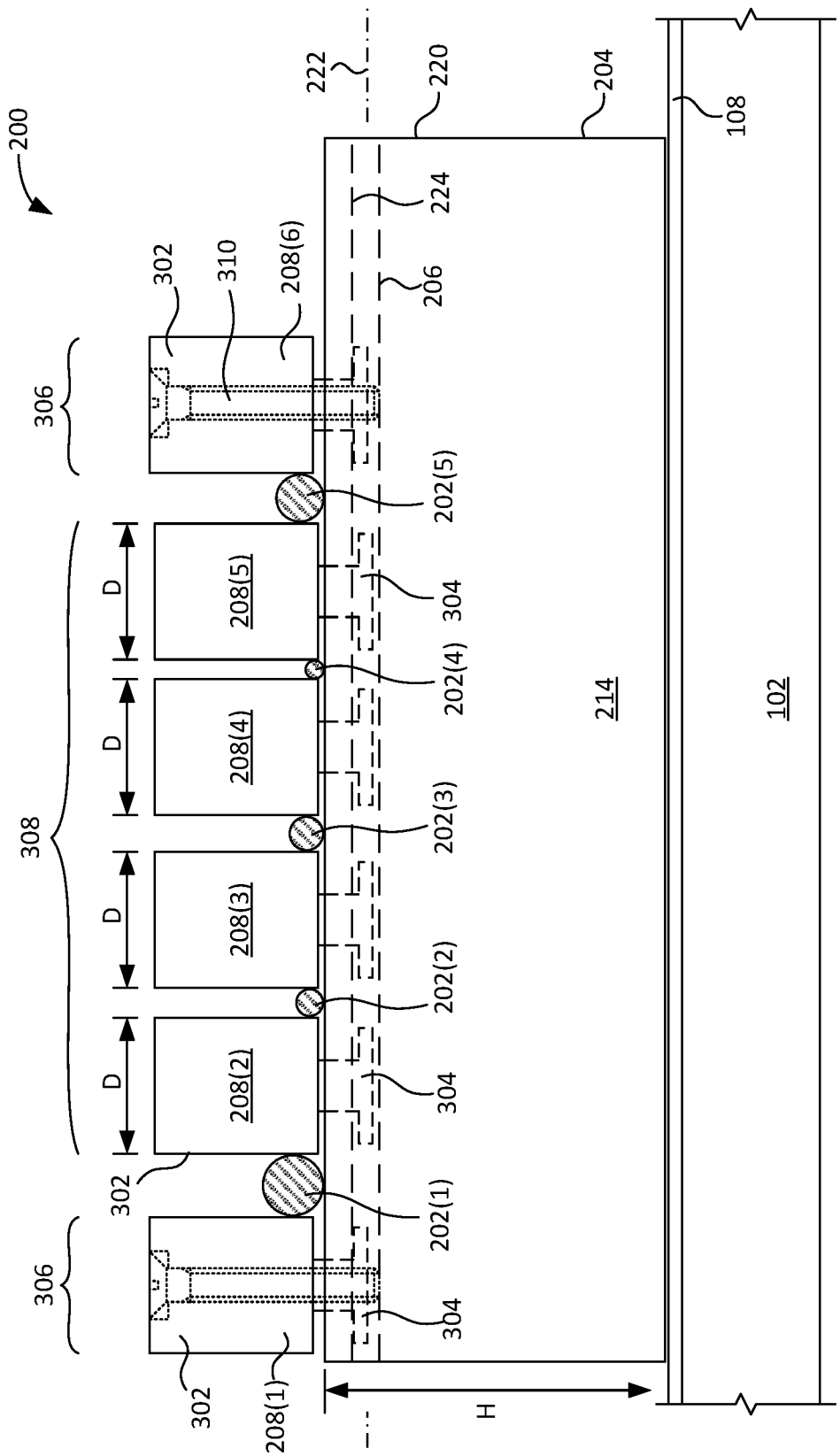
FIG. 3 is a front view of the spacer assembly of FIG. 2.
Figure 4:
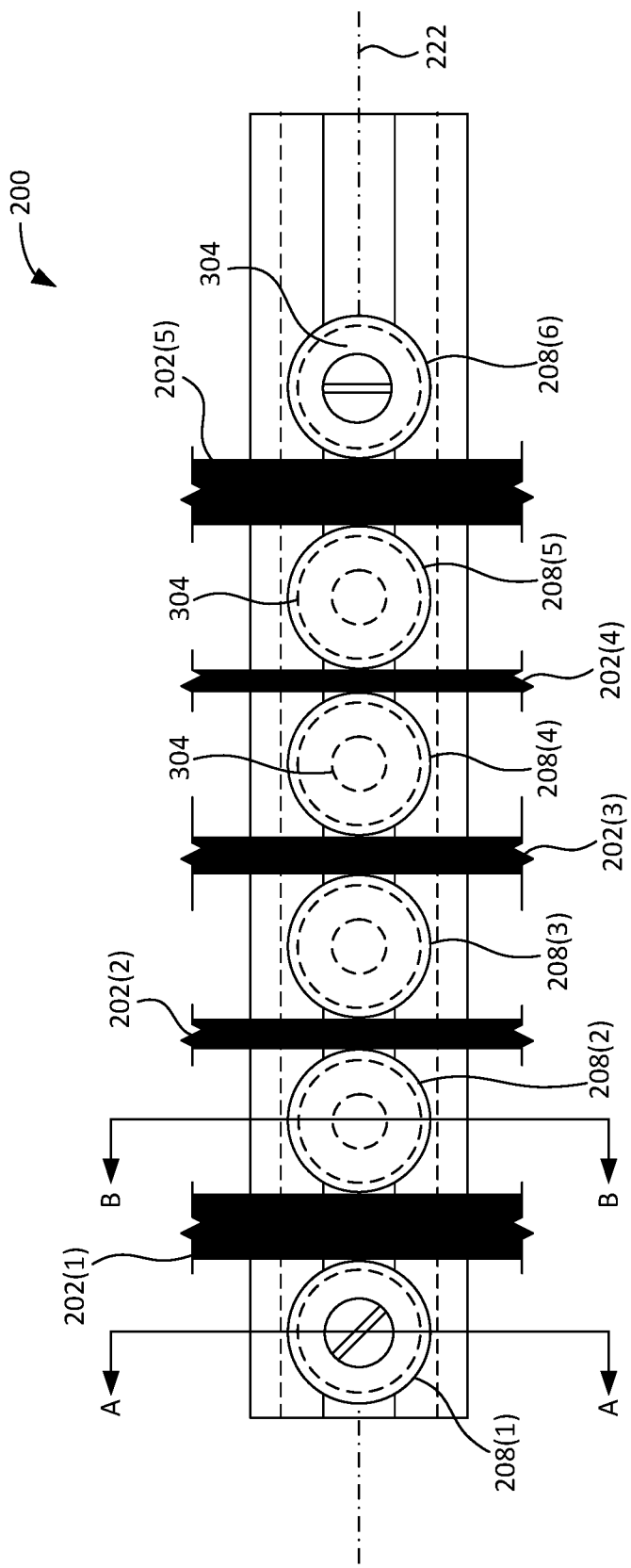
FIG. 4 is a top view of the spacer assembly of FIG. 2.

Spacer assembly 200 will now be further described with reference to FIGS. 3 and 4. FIG. 3 shows a front view of spacer assembly 200, whereas FIG. 4 shows a top view of spacer assembly 200. As shown, leads 202(1-5) are supported on top surface 212 of body 204 at a predetermined height, H, above ground plane 108. Additionally, spacer elements 208(1-6) facilitate equal spacing of leads 202(1-5) at the leads' outer circumferences as discussed above, based on the width (diameter in this case), D, of the interposing spacer elements 208. Because each of interposing spacer elements 208(2-5) have the same diameter, leads 202(1-5) are equally spaced.

FIGS. 3 and 4 further show that each spacer element 208(1-6) includes a cylindrical spacer portion 302 and a cylindrical adapter portion 304. Cylindrical spacer portion 302 of each spacer element 208(1-6) is disposed above top surface 212, where the cylindrical spacer portion 302 has the diameter, D. In contrast, the adapter portion 304 is disposed below the cylindrical portion 304 within guide 206 and is configured to movably engage guide 206, via channel 224 and slot 226. Adapter portion 304 defines multiple diameters such that spacer element 208 can be selectively positioned laterally along said axis 222, but cannot pull out of channel 224 vertically (FIG. 3). Adapter portion 304 is also sized to permit spacer element 208 to rotate within channel 224.

FIGS. 3 and 4 also illustrate how different groups of spacer elements 208(1-6) can include different structural features. Spacer elements 208(1-6) comprise both a securable group 306 and a floating group 308 of spacer elements 208. Securable group 306 includes spacer elements 208(1) and 208(6), which are the outer-most spacer elements 208. Each of spacer elements 208(1) and 208(6) includes a fixing mechanism 310, which is configured to selectively secure the associated spacer element 208 in position along axis 222 as described in more detail below. In contrast, floating group 308 includes spacer elements 208(2-5), which "float" between spacer elements 208(1) and 208(6), but are generally secured in position along axis 222 when each of spacer elements 208(1) and 208(6) are secured in position via their respective fixing mechanisms 310. Accordingly, there is one more spacer element 208 than lead 202 in this embodiment.

In use, spacer assembly 200 can be installed during EMC testing setup as follows. If not done so already, the adapter portions 304 of spacer element 208(1-6) are inserted in channel 224 of guide 206 such that spacer elements 208(1-6) are in the positional order shown in FIGS. 3 and 4. Spacer assembly 200 is then placed (and optionally secured with tape, etc.) on ground plane 108 such that spacer elements 208 are standing upward. Spacer element 208(1) is moved to the position shown and secured in position by actuating fixing mechanism 310. Lead 202(1) is then placed in contact with spacer element 208(1), after which spacer element 208(2) is moved along axis 222 until it is in contact with lead 202(1). Lead 202(2) is then placed in contact with spacer element 208(2) opposite lead 202(1). Spacer element 208(3) is then moved along axis 222 into contact with lead 202(2), and lead 202(3) is placed in contact with spacer element 208(3) opposite lead 202(2). Thereafter, spacer element 208(4) is moved along axis 222 into contact with lead 202(3), and lead 202(4) is placed in contact with spacer element 208(4) opposite lead 202(3). Then spacer element 208(5) is moved along axis 222 into contact with lead 202(4), and lead 202(5) is placed in contact with spacer element 208(5) opposite lead 202(4). Thereafter, spacer element 208(6) is moved along axis 222 into contact with lead 202(5) opposite spacer element 208(5). Spacer element 208(6) is then secured in position by actuating its fixing mechanism 310, which also secures spacer elements 208(1-6) and leads 202(1-5) in the contiguous arrangement shown.

Thus, spacer assembly 200 advantageously permits a plurality of leads 202(1-n) to be oriented in parallel at a predetermined spacing (D) at the outer circumferences of the leads 202(1-n) in accordance with lead spacing criteria for EMC testing. Additionally, spacer assembly 200 supports leads 202(1-n) above ground plane 108 at the desired predetermined height, H, further in accordance with ground plane spacing criteria for EMC testing. Spacer assembly 200 advantageously speeds up lead routing and spacing during initial EMC testing setup and reconfiguration by readily spacing leads and eliminating, or at least significantly reducing, the amount of lead taping.

FIG. 5 shows an end view of spacer assembly 200. FIG. 5 shows that guide 206 comprises a channel 224 formed through at least one of short sidewalls 218, 220 of body 204. Doing so facilitates insertion of as many spacer elements 208 in guide 206 as desired and enables spacer assembly 200 to be configured for different EUTs 110 with differing numbers of leads 202. Additionally, channel 224 is shown to be in the shape of an inverted-T, which defines slot 226 through top surface 212. The (cylindrical) adapter portion 304 of each spacer element 208 has a shape that is complementary to channel 224 such that the spacer element 208 can both slide axially and rotate therein.

FIG. 5 also shows how fixing mechanism 310 is configured to increase interference between spacer element 208(1) and guide 224. More particularly, fixing mechanism 310 comprises a threaded device (in this case a screw 510) that is configured to contact the bottom of channel 224 and move adapter portion 304 vertically into engagement with guide 206. Here, as screw 510 is screwed downward through spacer element 208(1), the bottom distal end of screw 510 protrudes through adapter portion 304 and selectively contacts the bottom of channel 224. Once screw 510 contacts channel 224, further advancement of screw 510 pushes spacer element 208(1) upward until the wider cylindrical region of adapter portion 304 contacts the underside of channel 224 as shown in FIG. 5. The increased friction between adapter portion 304 and channel 224 secures spacer element 208(1) in position. The fixing mechanism 310 of spacer element 208(6) operates similarly.

FIG. 6 is a partially exploded and cross-sectioned view of spacer element 208(1) taken along line A-A of FIG. 4. FIG. 6 shows that spacer element 208(1) defines a threaded bore 602 that receives screw 510 (not sectioned) therethrough. Screw 510 can be selectively advanced into contact with the bottom of channel 224 as discussed above. FIG. 7 shows a cross sectional view of spacer element 208(2) taken along lines B-B of FIG. 4. In contrast to FIG. 6, FIG. 7 shows that spacer elements 208(2) (and the others of floating group 308) are solid, unthreaded pieces.

With reference to FIGS. 2-7, the components of spacer assembly 200 discussed herein are formed from a non-hygroscopic material with low relative permittivity. Low relative permittivity is considered to be relative permittivity less than 5. However, components of spacer assembly 200 can be made from a non-hygroscopic material having a relative permittivity less than 4 or even less than 3. As a particular example, the components of spacer assembly 200 can be fabricated from a synthetic polymer, such as acetal (e.g., Delrin®), nylon, linen phenolic, etc. Forming the components of spacer assembly 200 from a material that is both non-hygroscopic and low relative permittivity is desirable because those material properties keep the inherent capacitance of spacer assembly 200 low, such that spacer assembly 200 does not negatively impact EMC testing.

The components of spacer assembly 200 can be fabricated in various ways. For example, the body 204 of spacer assembly 200 can be formed by molding, milling, extruding, 3D printing, or some combination thereof. Guide 206 can be formed in body 204, for example, by milling channel 224 through body 204 or during 3D printing. Spacer elements 208 can be formed by turning round-stock, drilling, tapping, 3D printing, or some combination thereof. Screws 510 can similarly be molded, die-cut, 3D printed, purchased, etc.

Figure 8:
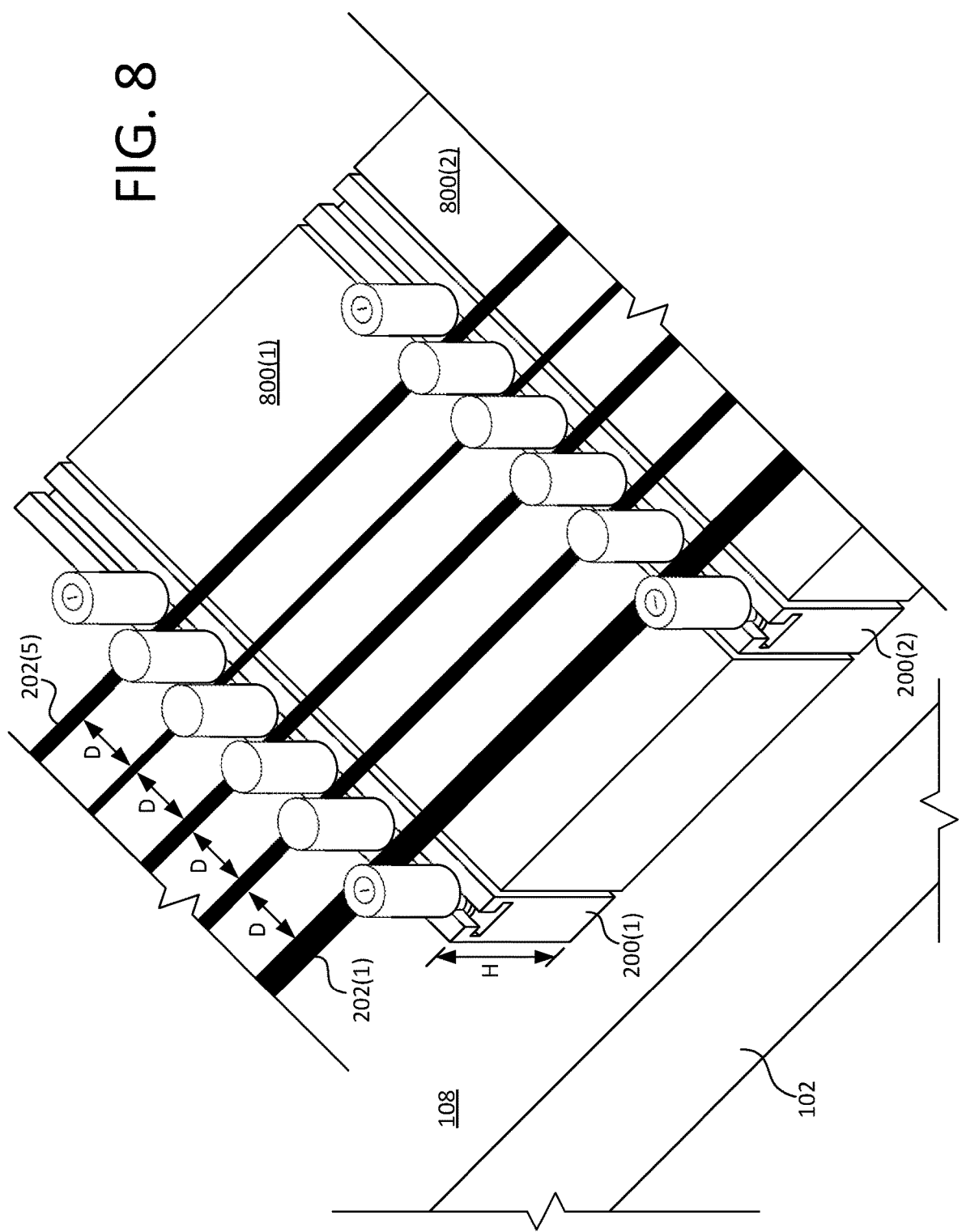
FIG. 8 is a perspective view of a plurality of spacer assemblies of FIG. 2 and a plurality of lead support structures in a close configuration.

Turning now to FIG. 8, FIG. 8 shows a plurality of spacer assemblies 200(1-x) (only two shown) used to equally space a plurality of leads 202(1-5) to a predetermined width (D) at their outer circumferences and to further space each of the leads 202(1-5) at a predetermined height, H, above ground plane 108. FIG. 8 further shows that a plurality of support structures 800(1-y) (e.g., Styrofoam blocks, etc.; only two shown) are used in conjunction with spacer assemblies 200(1-x) to prevent leads 202(1-5) from sagging in the runs between adjacent spacer assemblies 200(1-x). Spacer assemblies 200(1-x) and support structures 800(1-y) form a close configuration that supports leads 202(1-5) in parallel at the predetermined height, H, across the test bench 102. Support structures 800(1-y) also help maintain spacer assemblies 200(1-x) in a desired position on ground plane 200. It should be noted that spacer assembly 200 can be optionally affixed to ground plane 108 (e.g., with tape, fasteners, etc.) if it is desirable to do so. For example, placing tape over a spacer assembly 200 to adhere it to ground plane 108 can quickly add additional, temporary, stability to spacer assembly 200 if desired.

The spacer assembly 200 of the present invention advantageously enables rapid setup of the leads 202(1-5) in parallel, at the desired spacing, and at the desired height while eliminating (or significantly reducing) the taping of leads 202(1-5). Spacer assembly 200 makes the initial EMC testing setup process faster, which saves technician time. Reconfiguration of the leads 202(1-5) is also faster, because the spacer assembly 200 can be moved and/or the spacer elements repositioned. Moreover, because the spacer assembly 200 enables leads 202 to be equally spaced in a repeatable manner, as opposed to the prior art method, EMC testing is more repeatable across different test setups and testing occurrences.

While exemplary embodiments of spacer assembly 200 have been described above, it should be recognized that modifications can be made to spacer assembly 200 without departing from the spirit and scope of the invention. For example, body 204 can be elongated such that additional spacer elements 208 can be installed and utilized for spacing additional leads 202. As another example, spacer elements 208 can have a different common predetermined width (D) and/or body 204 can define a different predetermined height, H, depending on the EMC testing criteria being tested against. As yet another example, spacer assembly 200 can employ different sets of spacer elements 208 having different predetermined widths/diameters such that different leads can be spaced at different predetermined distances by the same assembly 200. As still another example, an alternative spacer assembly can be envisioned having spacer elements 208 oriented on multiple axes. However, the spacer assembly 200 having a single axis 200 provides good adjustability, because it is compact and readily relocated and oriented according to a desired test setup. As yet another example, the cross-sectional shape of channel 224 can be varied.

Figure 9:
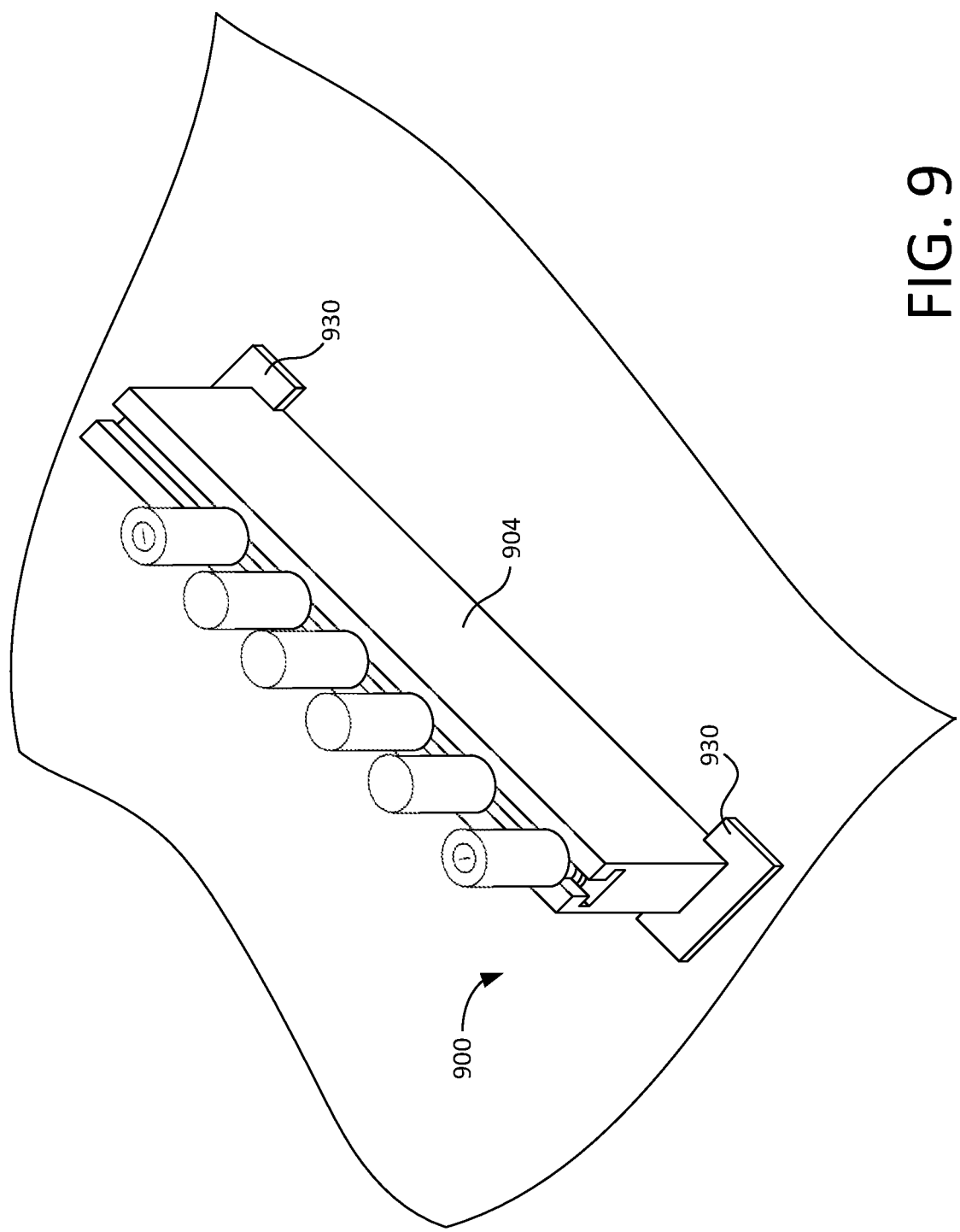
FIG. 9 is a perspective view showing an spacer assembly according to another exemplary embodiment of the present invention.

The dimensions of body 204 can also be adjusted as desired to meet a particular EMC testing application and/or to ensure that spacer assembly 200 is stable on ground plane 108. Care should be taken, however, to minimize the impact of the dimensions of spacer assembly 200 on the EMC testing, from an electromagnetic interference standpoint or otherwise. For example, the larger the volume of spacer assembly 200, the greater its inherent capacitance and ability to affect electromagnetic testing. As another example, in the case that bottom surface 210 and top surface 212 have different dimensions in a direction perpendicular to axis 222, the ability to closely configure support structures 800 and spacer assemblies is diminished. For this reason, the inventor recommends minimizing differences between the bottom and top surfaces 210 and 212 (e.g., to less than 12.5 mm (0.5 inches) total, etc.). Indeed, the embodiment of spacer assembly 200 as illustrated in FIGS. 2-8 provides good stability, low inherent capacitance, is readily adjustable in position on ground plane 108, and facilitates the close positioning of spacer assemblies and support structures 800 in alternation. As yet another possible modification, an alternative body 904 of a spacer assembly 900 can be manufactured with feet 930 for added stability, such as shown in FIG. 9. Feet 950 stabilize spacer assembly 900 but do not interfere with the placement of support structures 800 under leads 202.

Methods of the present invention will now be described with reference to FIG. 10. For the sake of clear explanation, these methods might be described with reference to particular elements or modules of the foregoing description. However, it should be noted that other elements or modules, whether explicitly described herein or created in view of the present disclosure, can be substituted for those referenced without departing from the scope of the present invention. Accordingly, the methods of the present invention are not limited to any particular element(s) that perform(s) any particular functions. Furthermore, the steps of the methods presented herein need not necessarily occur in the order shown and/or some steps might occur simultaneously. These and other variations of the disclosed methods will be readily apparent in view of this disclosure and are considered to be within the scope of the invention.

Figure 10:
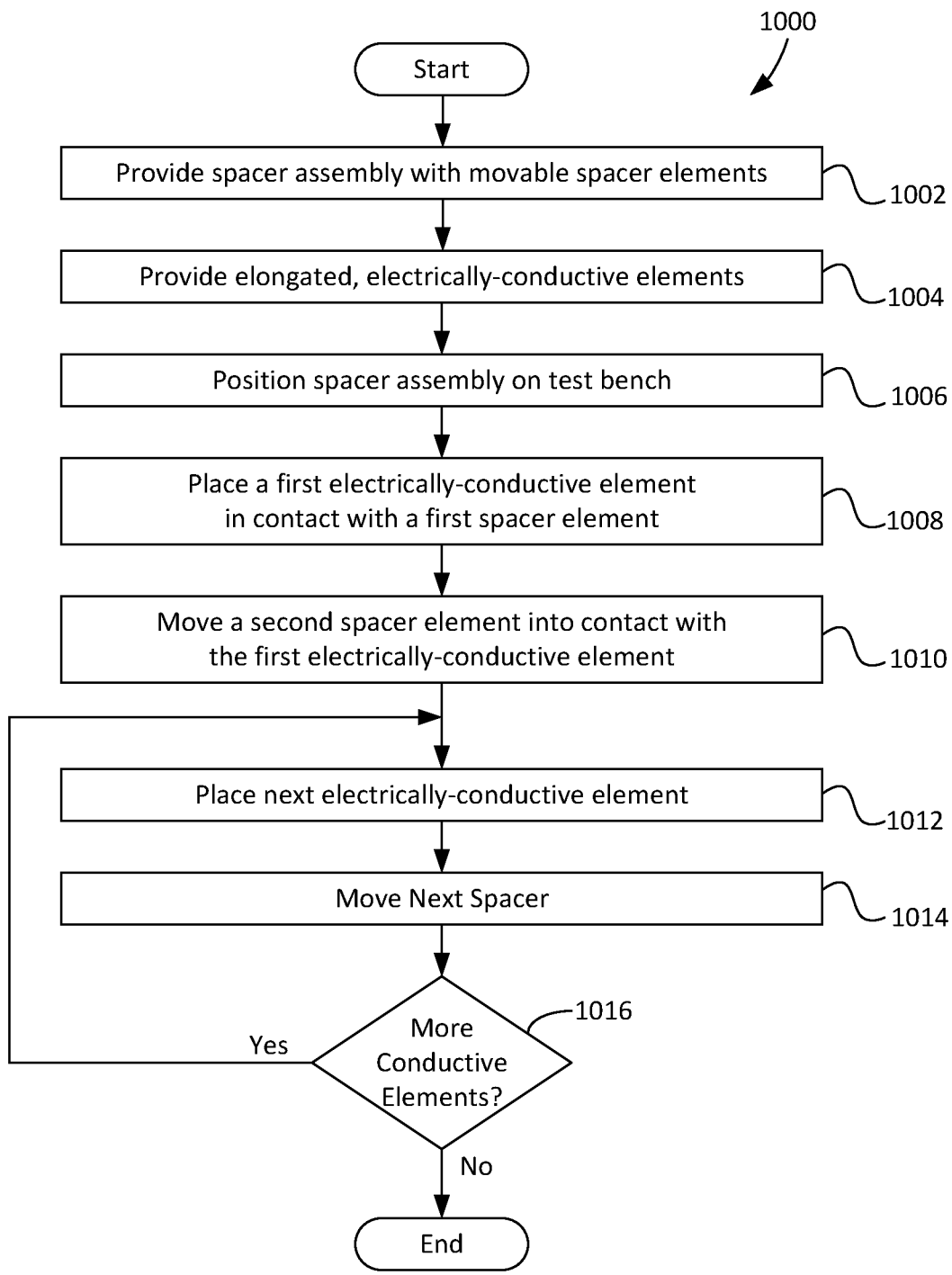
FIG. 10 is a flowchart summarizing an exemplary method for spacing leads coupled to electronic equipment for electromagnetic compatibility testing.

FIG. 10 shows a flowchart summarizing a method 1000 for spacing electrically-conductive elements (e.g., leads, etc.) coupled to equipment undergoing EMC testing. In a first step 1002, at least one spacer assembly is provided. The spacer assembly includes a body, a guide coupled to the body, and a plurality of spacer elements movably coupled to the guide along an axis defined by the guide. Each of the spacer elements has a predetermined width along the axis defined by the guide. In a second step 1004, a plurality of elongated, electrically-conductive elements (e.g., leads, etc.) are provided. In a third step 1006, the spacer assembly is positioned on a test bench configured for EMC testing such that the spacer elements are oriented upright. In a fourth step 1008, a first one of the electrically-conductive elements is placed over the body of the spacer assembly and in contact with a first one of the spacer elements. In a fifth step 1010, a second one of the spacer elements is moved into contact with the first electrically-conductive element opposite the first spacer element. In a sixth step 1012, a next one of the electrically-conductive elements is placed over the body of the spacer assembly and in contact with the second/prior-positioned spacer element such that the first and second/prior-placed electrically-conductive elements are separated by a predetermined width of the second/prior-placed spacer element. The predetermined width corresponds to an electromagnetic compatibility (EMC) testing criteria. In a seventh step 1014, a next one of the spacer elements is moved into contact with the second/prior-placed electrically-conductive element. In an eighth step 1016, a determination is made if there are more electrically-conductive elements to place using the spacer assembly. If so, method 1000 returns to sixth step 1012. If not, method 1000 ends. Method 1000 can be repeated for placing the electrically-conductive elements in additional spacer assemblies.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A spacer assembly comprising:
    a body defining a bottom surface and a top surface opposite said bottom surface;
    a guide coupled to said top surface and extending along an axis; and
    a plurality of spacer elements movably coupled to said guide along said axis and being configured to receive a plurality of elongated, electrically-conductive elements therebetween, each of said spacer elements extending above said top surface; and wherein
    each of said spacer elements defines a predetermined width along said axis;
    each of said plurality of spacer elements comprises
        a cylindrical portion disposed above said top surface, said cylindrical portion having a diameter corresponding to said predetermined width, and
        an adapter portion configured to movably engage said guide such that said each of said spacer elements can be adjustably positioned along said axis;
    said adapter portion permits rotation of said each of said spacer elements within said guide;
    when said plurality of electrically-conductive elements are placed in parallel between and in contact with said spacer elements, a spacing between adjacent ones of said electrically-conductive elements corresponds to said predetermined width of an interposing one of said spacer elements; and
    said predetermined width corresponds to a first electromagnetic compatibility (EMC) testing criteria.

2. The spacer assembly of claim 1, wherein:
    said top surface is disposed at a predetermined height above said bottom surface;
    when said plurality of electrically-conductive elements are placed between said spacer elements, said electrically-conductive elements are further disposed at said predetermined height; and
    said predetermined height corresponds to a second EMC testing criteria different from said first EMC testing criteria.

3. The spacer assembly of claim 2, wherein each of said predetermined width and said predetermined height varies by no more than 5%.

4. The spacer assembly of claim 1, wherein said predetermined width varies by no more than 5%.

5. The spacer assembly of claim 1, wherein said body, said guide, and said plurality of spacer elements are formed from a material having relative permittivity of no more than 5.

6. The spacer assembly of claim 1, wherein at least one of said plurality of spacer elements comprises a fixing mechanism configured to selectively secure said at least one spacer element in position along said axis.

7. The spacer assembly of claim 6, wherein said fixing mechanism is configured to increase interference between said at least one spacer element and said guide.

8. The spacer assembly of claim 7, wherein said fixing mechanism comprises a threaded member configured to move said at least one spacer element into engagement with said guide.

9. The spacer assembly of claim 1, wherein said cylindrical portion of each of said plurality of spacer elements has the same diameter.

10. The spacer assembly of claim 1, wherein said guide is formed in said body.

11. The spacer assembly of claim 10, wherein said guide comprises a channel formed through said body along said axis, said channel defining a slot through said top surface.

12. The spacer assembly of claim 11, wherein:
said body defines one or more sidewalls between said top and said bottom surfaces;
said channel is formed through at least one of said sidewalls; and
said channel comprises an inverted-T channel.

13. A spacer assembly comprising:
a body defining a bottom surface, a top surface opposite said bottom surface, and one or more sidewalls between said top and said bottom surfaces;
a guide coupled to said top surface and extending along an axis; and
a plurality of spacer elements movably coupled to said guide along said axis and being configured to receive a plurality of elongated, electrically-conductive elements therebetween, each of said spacer elements extending above said top surface; and wherein
said guide is formed in said body;
said guide comprises a channel formed through said body along said axis and through at least one of said sidewalls, said channel defining a slot through said top surface;
said channel comprises an inverted-T channel;
each of said spacer elements defines a predetermined width along said axis;
when said plurality of electrically-conductive elements are placed in parallel between and in contact with said spacer elements, a spacing between adjacent ones of said electrically-conductive elements corresponds to said predetermined width of an interposing one of said spacer elements; and
said predetermined width corresponds to a first electromagnetic compatibility (EMC) testing criteria.

14. The spacer assembly of claim 13, wherein:
said top surface is disposed at a predetermined height above said bottom surface;
when said plurality of electrically-conductive elements are placed between said spacer elements, said electrically-conductive elements are further disposed at said predetermined height; and
said predetermined height corresponds to a second EMC testing criteria different from said first EMC testing criteria.

15. The spacer assembly of claim 14, wherein each of said predetermined width and said predetermined height varies by no more than 5%.

16. The spacer assembly of claim 13, wherein said predetermined width varies by no more than 5%.

17. The spacer assembly of claim 13, wherein said body, said guide, and said plurality of spacer elements are formed from a material having relative permittivity of no more than 5.

18. The spacer assembly of claim 13, wherein at least one of said plurality of spacer elements comprises a fixing mechanism configured to selectively secure said at least one spacer element in position along said axis.

19. The spacer assembly of claim 18, wherein said fixing mechanism is configured to increase interference between said at least one spacer element and said guide.

20. The spacer assembly of claim 19, wherein said fixing mechanism comprises a threaded member configured to move said at least one spacer element into engagement with said guide.

21. The spacer assembly of claim 13, wherein:
each of said plurality of spacer elements comprises a cylindrical portion disposed above said top surface, said cylindrical portion having a diameter corresponding to said predetermined width; and
said cylindrical portion of each of said plurality of spacer elements has the same diameter.

22. The spacer assembly of claim 13, wherein:
each of said plurality of spacer elements comprises a cylindrical portion disposed above said top surface, said cylindrical portion having a diameter corresponding to said predetermined width; and
each of said spacer elements comprises an adapter portion configured to movably engage said guide such that said each of said spacer elements can be adjustably positioned along said axis.

* * * * *